(12) United States Patent
Chao et al.

(10) Patent No.: US 7,960,258 B2
(45) Date of Patent: Jun. 14, 2011

(54) METHOD FOR FABRICATING NANOSCALE THERMOELECTRIC DEVICE

(75) Inventors: Chuen-Guang Chao, Hsinchu (TW); Jung-Hsuan Chen, Jhubei (TW); Ta-Wei Yang, Taoyuan (TW)

(73) Assignee: National Chiao Tung University, Hsinchu (TW)

( * ) Notice: Subject to any disclaimer, the term of this patent is extended or adjusted under 35 U.S.C. 154(b) by 618 days.

(21) Appl. No.: 12/117,835

(22) Filed: May 9, 2008

(65) Prior Publication Data

US 2011/0059568 A1 Mar. 10, 2011

(30) Foreign Application Priority Data

Feb. 15, 2008 (TW) ................. 97105295 A

(51) Int. Cl.
*H01L 21/00* (2006.01)
(52) U.S. Cl. ........ 438/479; 438/445; 438/551; 438/666; 257/E21.251; 257/E21.463; 257/E21.589; 257/E29.001; 257/E51.001; 977/700; 977/762; 977/781; 977/833; 977/888
(58) Field of Classification Search .................. 438/400, 438/445, 478, 479, 551, 666; 257/E21.251, 257/E21.463, E21.589, E29.001, E31.033, 257/E51.001; 977/700, 762, 781, 833, 888
See application file for complete search history.

(56) References Cited

U.S. PATENT DOCUMENTS

| | | | |
|---|---|---|---|
| 6,231,744 B1 * | 5/2001 | Ying et al. ................. 205/223 |
| 6,969,679 B2 * | 11/2005 | Okamura et al. ............. 438/666 |
| 7,098,393 B2 * | 8/2006 | Fleurial et al. .............. 136/240 |
| 7,189,435 B2 * | 3/2007 | Tuominen et al. ............ 427/472 |
| 7,488,671 B2 * | 2/2009 | Corderman et al. .......... 438/479 |
| 7,517,466 B2 * | 4/2009 | Asakawa et al. ............. 216/41 |
| 7,686,885 B2 * | 3/2010 | Ku et al. ..................... 117/89 |
| 7,846,819 B2 * | 12/2010 | Pribat et al. ................. 438/479 |
| 2005/0060884 A1 * | 3/2005 | Okamura et al. ............. 29/831 |
| 2005/0257821 A1 | 11/2005 | Ramanathan et al. |
| 2007/0261730 A1 * | 11/2007 | Seker et al. ................. 136/224 |
| 2008/0241755 A1 * | 10/2008 | Franklin et al. .............. 430/296 |
| 2009/0194424 A1 * | 8/2009 | Franklin et al. .............. 205/114 |
| 2010/0319759 A1 * | 12/2010 | Fisher et al. ................. 136/252 |

FOREIGN PATENT DOCUMENTS

| | | |
|---|---|---|
| TW | I266401 | 3/2006 |
| TW | I262221 | 9/2006 |
| TW | I280649 | 12/2006 |

OTHER PUBLICATIONS

J. R. Lim, J. F. Whitacre, J. P. Fleurial, C. K. Huang, M. A. Ryan, N. V. Myung, Adv. Mater. 2005, 17, 1488.

* cited by examiner

*Primary Examiner* — Michael S Lebentritt
(74) *Attorney, Agent, or Firm* — Rosenberg, Klein & Lee

(57) ABSTRACT

The present invention discloses a method for fabricating a nanoscale thermoelectric device, which comprises steps: providing at least one template having a group of nanoscale pores; forming a substrate on the bottom of the template; injecting a molten semiconductor material into the nanoscale pores to form a group of semiconductor nanoscale wires; removing the substrate to obtain a semiconductor nanoscale wire array; and using metallic conductors to cascade at least two semiconductor nanoscale wire arrays to form a thermoelectric device having a higher thermoelectric conversion efficiency.

24 Claims, 9 Drawing Sheets

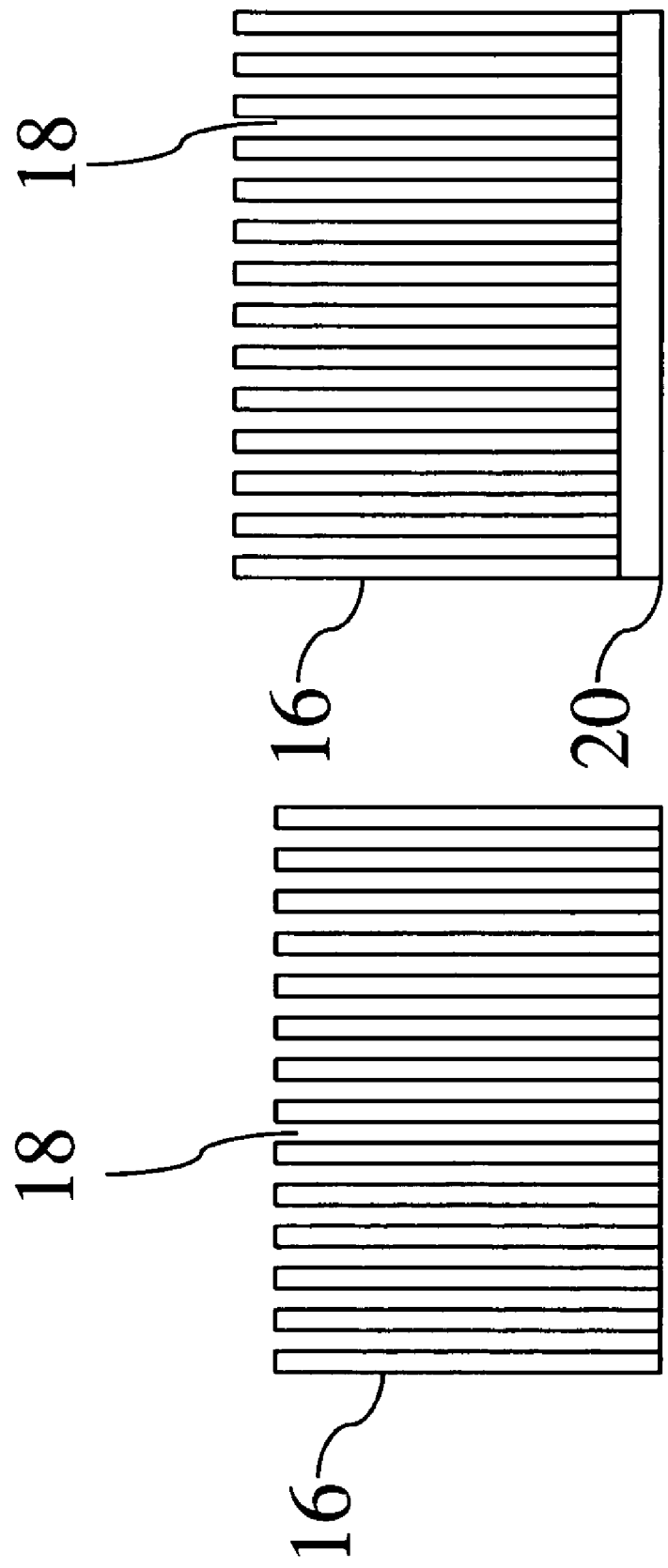

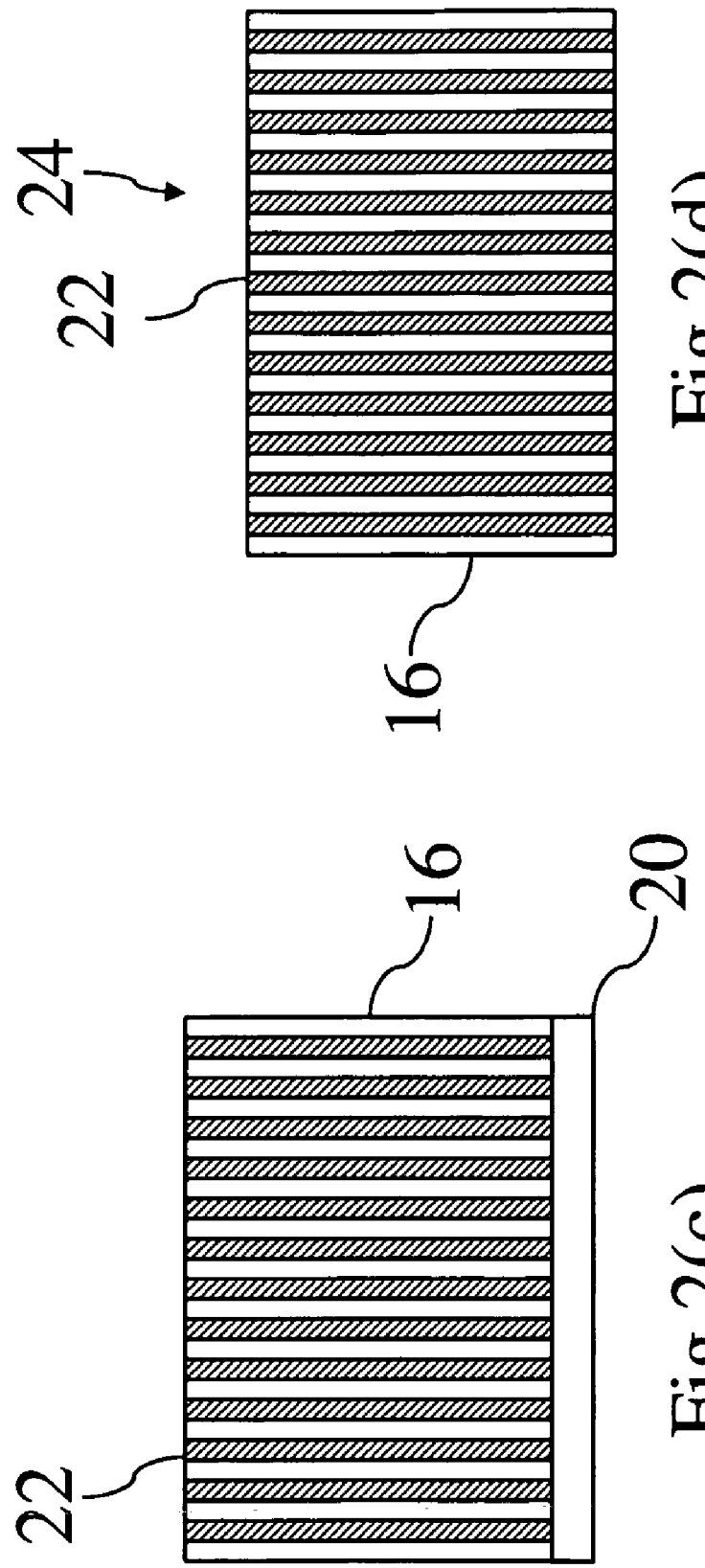

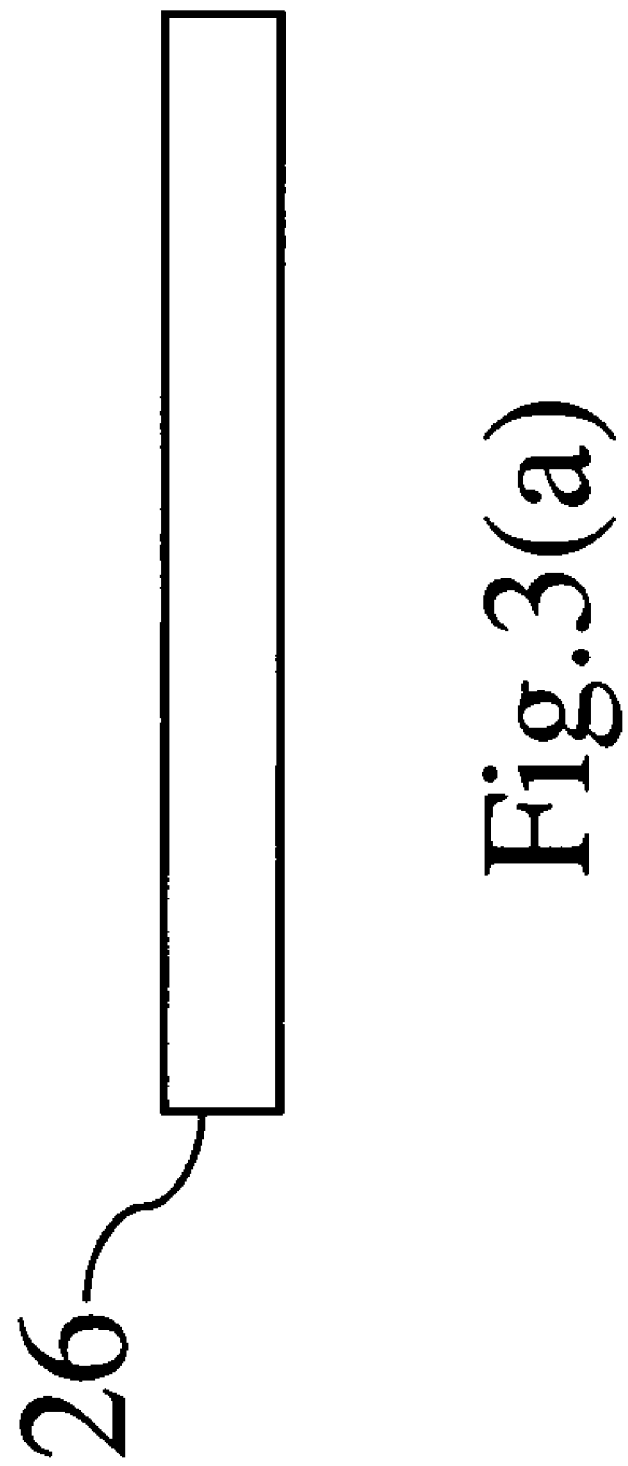

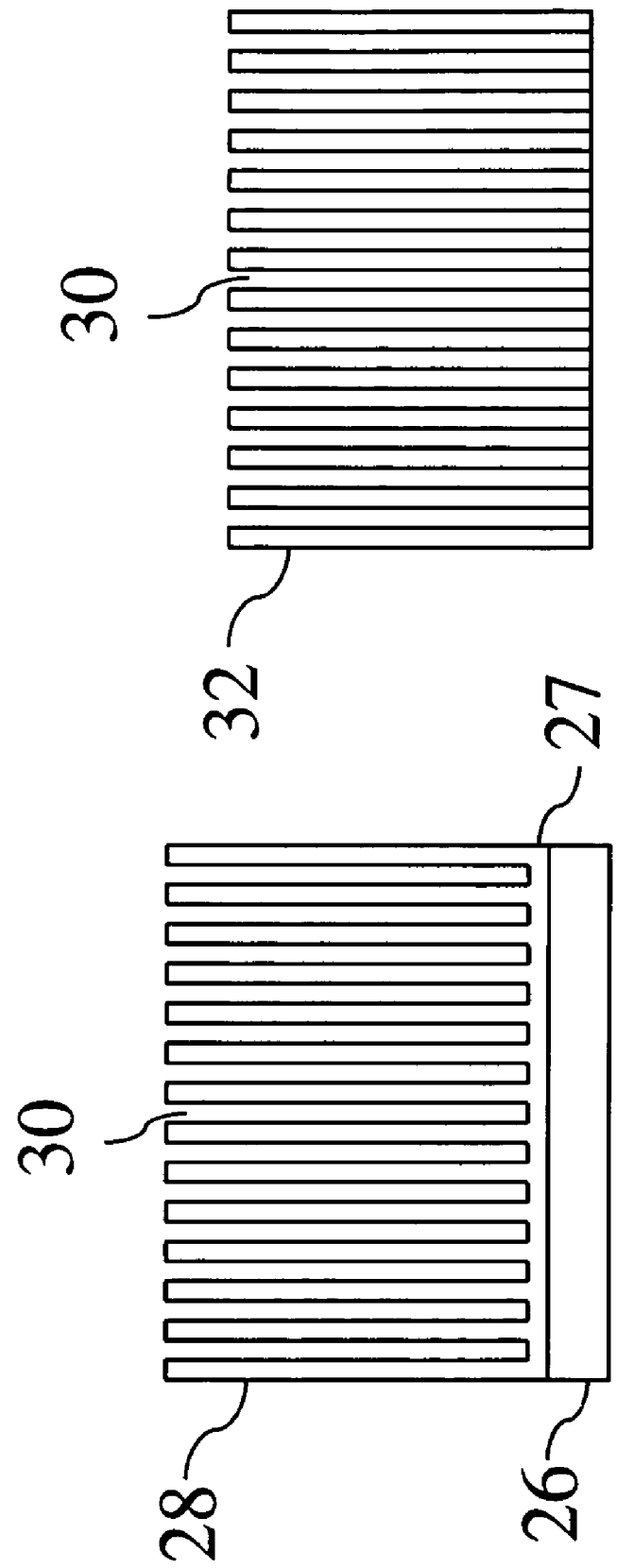

METHOD FOR FABRICATING NANOSCALE THERMOELECTRIC DEVICE

BACKGROUND OF THE INVENTION

1. Field of the Invention

The present invention relates to a fabrication method, particularly to a method for fabricating a nanoscale thermoelectric device.

2. Description of the Related Art

Few years ago, Intel Company announced that the dual-core microprocessor would replace the single-core microprocessor because the development of the existing single-core microprocessor had reached its ultimate. Under the current packaging design, increasing the working clock of the single-core microprocessor will generate much more heat and obviously increase the heat-dissipation cost without increasing the performance equally. Therefore, a 65-nm dual-core process is a necessary approach to promote the performance of microprocessors. However, the miniaturized, high-speed, and high performance chips bear the problem of heat dissipation. If the problem of heat dissipation cannot be resolved, many key elements in the fields of communication, optoelectronics, power, aerospace and biomedicine will be influenced. From the above discussion, it can be seen that heat management plays a very important role in the advanced chips.

Important heat-dissipation materials include: heat pipes, thermal interface materials and thermoelectric materials. Refer to FIG. 1. A thermoelectric element may include two different materials (such as a P-type semiconductor 10 and an N-type semiconductor 12) and a load 14, which form a loop. When there is a temperature difference between the ends of the P-type semiconductor 10 and the N-type semiconductor 12, a current will appear in the loop. In other words, the thermoelectric element can directly convert heat into electricity. A Taiwan patent of Publication No. I280649 uses thermoelectric semiconductor blocks to build a thermoelectric element. However, the thermoelectric element has a poor thermoelectric conversion efficiency because it has larger dimensions. A Taiwan patent of Publication No. I266401 uses a single type of material to build a thermoelectric element. However, the thermoelectric element also has a poor thermoelectric conversion efficiency because it only uses a single type of element. A Taiwan patent of Publication No. I262221 uses a hydraulic method to fabricate nanoscale wires and uses an aluminum baseplate as the substrate of the template of the nanoscale wires. The prior art is not suitable to fabricate nanoscale wires having a melting point close to or higher than the melting point of aluminum. In a technical literature, by J. R. Lim, J. F. Whitacre, J. P. Fleurial, C. K. Huang, M. A. Ryan, N. V. Myung, Adv. Mater. 2005, 17, 1488, an electrodeposition method is used to deposit a $Bi_2Te_3$ (N-type) nanoscale wire and a BiSbTe (P-type) nanoscale wire on a template, and then a photolithographic technology and photomasks are used to fabricate an element. The prior art is usually adopted. However, the equipment is expensive, and the fabrication process is complicated, and the environmental control is rigid. Therefore, the prior art is not suitable for mass production. The electrodeposition method itself is a simple process. However, electrodeposition is apt to have impurities and is hard to control alloy composition, particularly the composition of a more than ternary alloy.

Accordingly, the present invention proposes a method for fabricating a nanoscale thermoelectric device to overcome the abovementioned problems, whereby a thermoelectric element having P-type and N-type nanoscale wires can be fabricated, and whereby the alloy compositions of the nanoscale wires can be precisely controlled.

SUMMARY OF THE INVENTION

The primary objective of the present invention is to provide a method for fabricating a nanoscale thermoelectric device, whereby a high thermoelectric conversion efficiency element having P-type and N-type nanoscale wires can be fabricated.

Another objective of the present invention is to provide a method for fabricating a nanoscale thermoelectric device, wherein substrates made of different materials are adopted to fabricate structures with nanoscale pores, and whereby high-melting point nanoscale wires can be fabricated by using the nanoscale pores.

Further objective of the present invention is to provide a method for fabricating a nanoscale thermoelectric device, whereby the compositions of the alloys for nanoscale wires can be precisely controlled.

To achieve the abovementioned objectives, the present invention proposes a method for fabricating a nanoscale thermoelectric device, which comprises: providing at least one template having a group of nanoscale pores; forming a substrate on the bottom of the template; injecting a molten semiconductor material into the nanoscale pores in a vacuum environment with a pressure casting method to form a group of semiconductor nanoscale wires; removing the substrate to obtain a semiconductor nanoscale wire array; using metallic conductors to cascade at least two semiconductor nanoscale wire arrays; and forming insulating layers over the metallic conductors.

Below, the preferred embodiments of the present invention are described in detail in cooperation with the drawings to make easily understood the technical contents and accomplishments of the present invention.

BRIEF DESCRIPTION OF THE DRAWINGS

FIG. 2.(a) to FIG. 2(d) are diagrams schematically showing the steps of fabricating a semiconductor nanoscale wire array according to one embodiment of the present invention;

FIG. 3(a) to FIG. 3(f) are diagrams schematically showing the steps of fabricating a semiconductor nanoscale wire array according to another embodiment of the present invention.

DETAILED DESCRIPTION OF THE INVENTION

Figure 1:
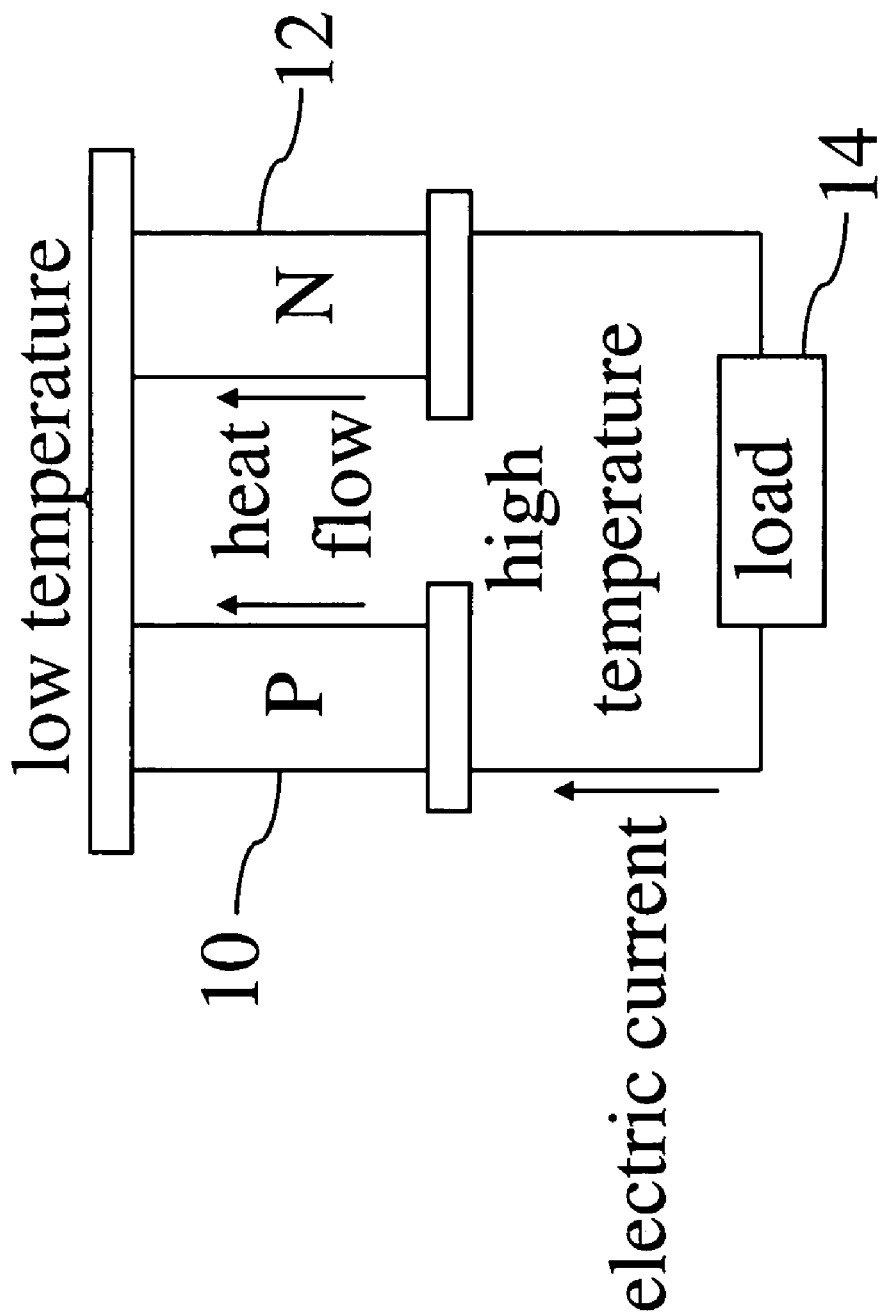
FIG. 1 is a diagram schematically showing that a conventional thermoelectric material generates electric power.

IC and semiconductor fabrication still dominates the science and technology industry in Taiwan. As the current trend of 3C products is toward cheapness and slimness, heat dissipation has become the biggest challenge in the field concerned. Therefore, the market of high-performance heat-dissipation elements will expand considerably with the stable growth of computer and optoelectronic industries. Below is described in detail a method for fabricating a high-efficiency nanoscale thermoelectric device.

Refer to from FIG. 2.(a) to FIG. 2(d) diagrams schematically showing the steps of fabricating a semiconductor nanoscale wire array according to one embodiment of the present invention. As shown in FIG. 2(a), a template 16 having a group of nanoscale pores 18 is provided firstly. The template 16 may be made of alumina, titanium oxide, silicon dioxide, opal or zeolite. The nanoscale pores 18 may have an appearance of a triangular, rectangular or circular array, and the array has an area of at least 1 square μm. The group of nanoscale pores 18 has at least one nanoscale pore with a diameter of between 1 and 1000 nm and a length of between 100 nm and 300 μm. Next, as shown in FIG. 2 (b), a substrate 20 having a thickness of between 100 nm and 100 μm is formed on the bottom of the template 16. The substrate 20 may be formed with a PVD (Physical Vapor Deposition) method, a CVD (Chemical Vapor Deposition) method, an electroplating method, an electroless plating method, a chemical deposition method, a hot-dip coating method, or a vapor deposition method. The substrate 20 may be made of a ceramic material or a metallic material having a melting point higher than that of aluminum, and the metallic material may be nickel, titanium, copper or a stainless steel. A liquid cannot be injected into the pores unless the surface pressure of the pores is overcome. As shown in FIG. 2(c), a molten semiconductor material is injected into the pores 18 to form a group of semiconductor nanoscale wires 22 with a pressure casting method in a vacuum environment of from 100 to $10^{-7}$ torr. The pressure casting method may be a hydraulic, oil-hydraulic, or pneumatic die-casting method with a pressure ranging from 1 to 20000 kg/cm$^2$. If the semiconductor nanoscale wire 22 is a nanoscale alloy wire, the composition of the alloy can be accurately controlled because the alloy solidifies directly from a liquid state. As the nanoscale wires have uniform dimensions, and as the nanoscale pores 18 have a high filling rate, the nanoscale wires have a pretty surface topography. As shown in FIG. 2 (d), the substrate 20 is removed with a wet-etching method to obtain a semiconductor nanoscale wire array 24. In the abovementioned process, if the molten semiconductor material is a molten P-type semiconductor material of an a binary alloy or more than binary alloy, the semiconductor nanoscale wire 22 is a P-type semiconductor nanoscale wire, and the semiconductor nanoscale wire array 24 is a P-type semiconductor nanoscale wire array. If the molten semiconductor material is a molten N-type semiconductor material of a binary alloy or more than binary alloy, the semiconductor nanoscale wire 22 is an N-type semiconductor nanoscale wire, and the semiconductor nanoscale wire array 24 is an N-type semiconductor nanoscale wire array.

Figure 3E:
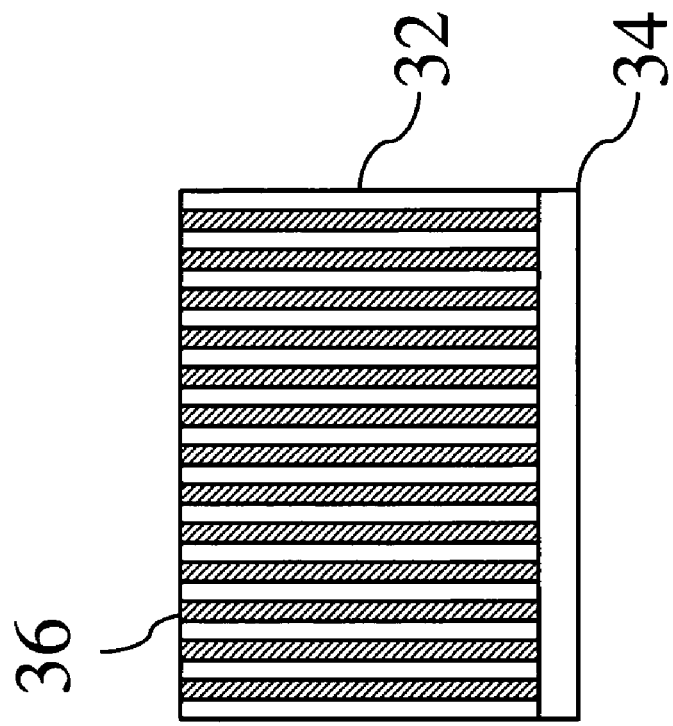
Figure 3D:
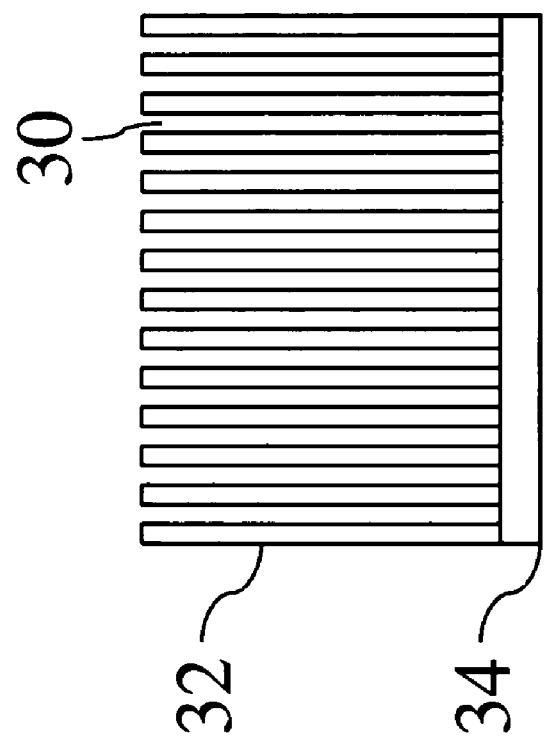
Figure 3F:
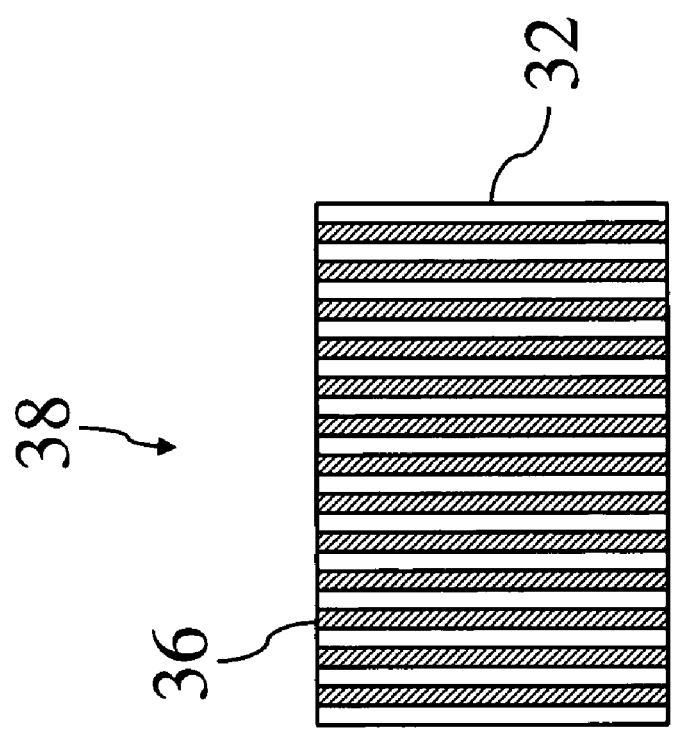

In addition to the embodiment mentioned above, the present invention further provides another embodiment. Refer to from FIG. 3 (a) to FIG. 3 (f) diagrams schematically showing the steps of fabricating a semiconductor nanoscale wire array according to another embodiment of the present invention. As shown in FIG. 3 (a), at least one aluminum substrate 26 is provided firstly. Next, as shown in FIG. 3 (b), a first oxide layer 27 and a second oxide layer 28 are sequentially formed over the aluminum substrate 26, and the second oxide layer 28 has a group of nanoscale pores 30. Both the first and second oxide layers 27 and 28 are made of alumina. The nanoscale pores 30 may have an appearance of a triangular, rectangular or circular array, and the array has an area of at least 1 square μm. The group of nanoscale pores 30 has at least one nanoscale pore 30 with a diameter of between 1 and 1000 nm and a length of between 100 nm and 300 μm. Next, as shown in FIG. 3(c), the aluminum substrate 26 and the first oxide layer 27 (the barrier layer or the dense oxide layer) are removed with a wet-etching method to obtain a template 32 with the nanoscale pores 30. In addition to alumina, the template 32 may also be made of titanium oxide, silicon dioxide, opal or zeolite. Next, as shown in FIG. 3 (d), a substrate 34 having a thickness of between 100 nm and 100 μm is formed on the bottom of the template 32. The substrate 34 may be formed with a PVD (Physical Vapor Deposition) method, a CVD (Chemical Vapor Deposition) method, an electroplating method, an electroless plating method, a chemical deposition method, a hot-dip coating method, or a vapor deposition method. The substrate 34 may be made of a ceramic material or a metallic material having a melting point higher than that of aluminum, and the metallic material may be nickel, titanium, copper or a stainless steel. A liquid cannot be injected into the pores unless the surface pressure of the pores is overcome. As shown in FIG. 3 (e), a molten semiconductor material is injected into the pores 30 to form a group of semiconductor nanoscale wires 36 with a pressure casting method in a vacuum environment of from 100 to $10^{-7}$ torr. The pressure casting method may be a hydraulic, oil-hydraulic, or pneumatic die-casting method with a pressure ranging from 1 to 20000 kg/cm$^2$. If the semiconductor nanoscale wire 36 is a nanoscale alloy wire, the composition of the alloy can be accurately controlled because the alloy solidifies directly from a liquid state. As the nanoscale wires have uniform dimensions, and as the nanoscale pores 30 have a high filling rate, the nanoscale wires have a pretty surface topography. As shown in FIG. 3 (f), the substrate 34 is removed with a wet-etching method to obtain a semiconductor nanoscale wire array 38. In the abovementioned process, if the molten semiconductor material is a molten P-type semiconductor material of an at least binary alloy, the semiconductor nanoscale wire 36 is a P-type semiconductor nanoscale wire, and the semiconductor nanoscale wire array 38 is a P-type semiconductor nanoscale wire array. If the molten semiconductor material is a molten N-type semiconductor material of an at least binary alloy, the semiconductor nanoscale wire 36 is an N-type semiconductor nanoscale wire, and the semiconductor nanoscale wire array 38 is an N-type semiconductor nanoscale wire array.

Figure 4A:
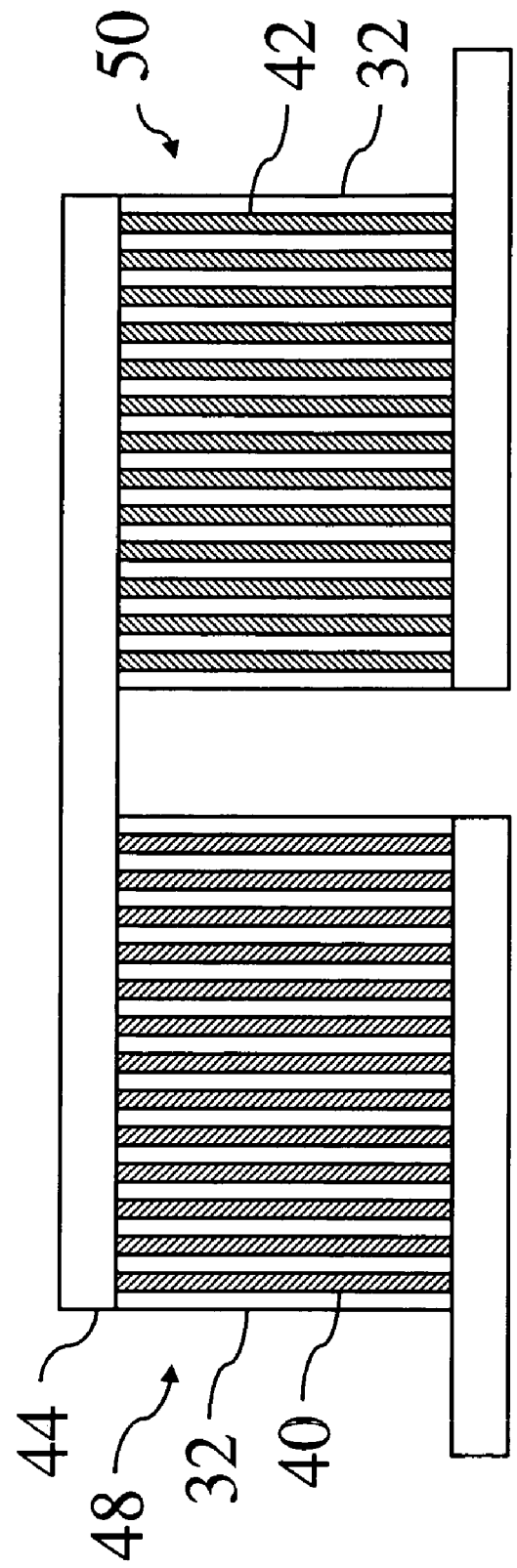
FIG. 4(a) and FIG. 4(b) are diagrams schematically showing the steps of fabricating a nanoscale thermoelectric element according to the present invention.
Figure 4B:
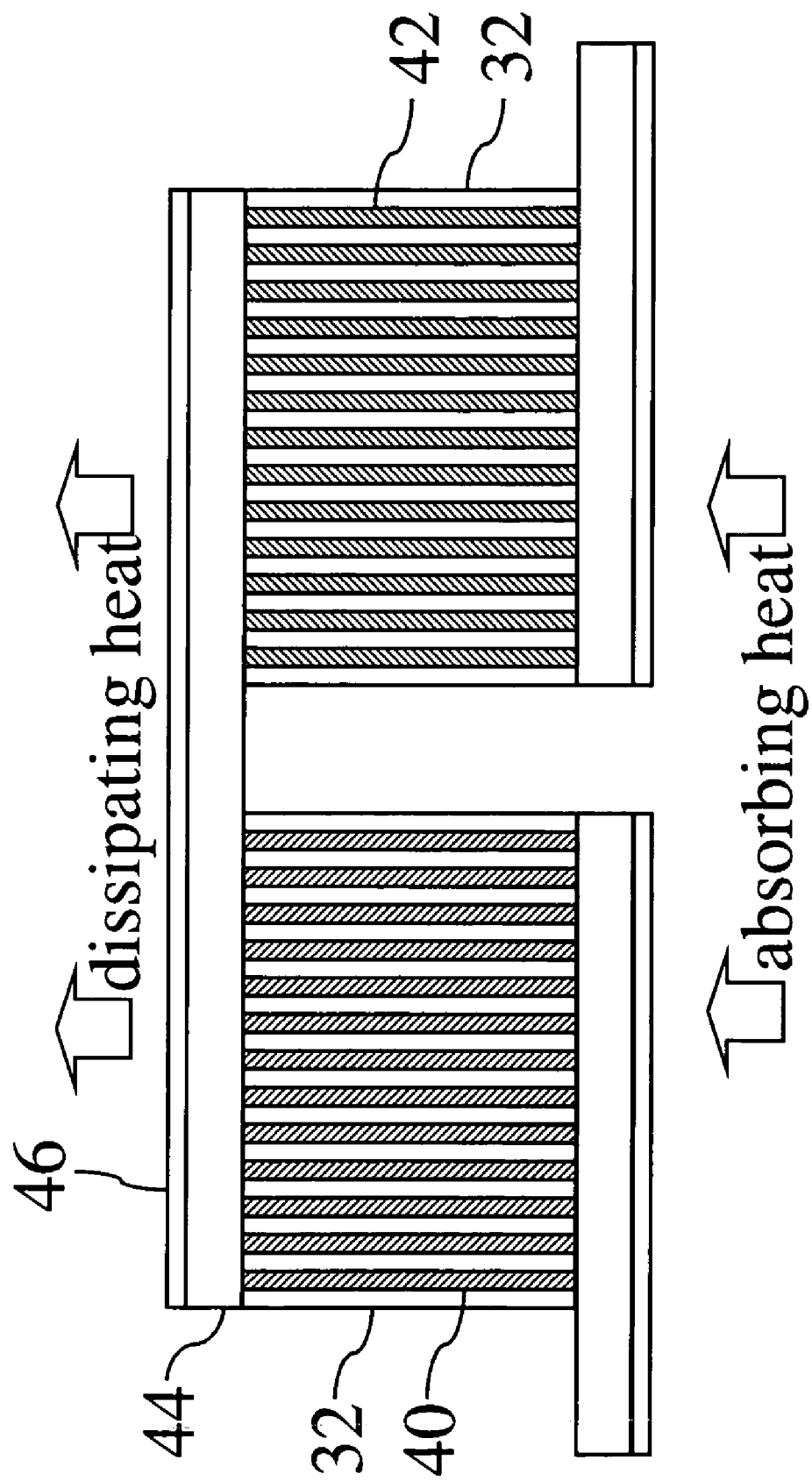

Refer to from FIG. 4 (a) and FIG. 4(b) diagrams schematically showing the steps of fabricating a nanoscale thermoelectric element according to the present invention. The present process is to assemble the semiconductor nanoscale wire arrays fabricated in either of the preceding processes. In either of the preceding process, when the molten semiconductor material is a molten N-type semiconductor material, the semiconductor nanoscale wire is an N-type semiconductor nanoscale wire 40. When the molten semiconductor material is a molten P-type semiconductor material, the semiconductor nanoscale wire is a P-type semiconductor nanoscale wire 42. As shown in FIG. 4 (a), a conductive glue is respectively applied to the tops and bottoms of the N-type semiconductor nanoscale wire array 48 and the P-type semiconductor nanoscale wire array 50; via the conductive glue, metallic conductors 44 are stuck onto the N-type semiconductor nanoscale wire array 48 and the P-type semiconductor nanoscale wire array 50 and connect them in series. The metallic conductor 44 may have a shape of a thread, a column, a plate or a block and may be made of gold, copper, silver, aluminum, a tin-lead alloy or a tin-silver-copper alloy. Next, as shown in FIG. 4 (b), insulating layers 46 are formed on the metallic conductors 44 to insulate the nanoscale thermoelectric element from other electric effects. Thus is completed the nanoscale thermoelectric element.

As the world relies on fossil fuels too much, air pollution and energy crises emerge finally. Therefore, many nations have budgeted more funds in the researches of substitute fuels. Besides, improving energy efficiency is also an important topic in the subject. Thus, using thermoelectric materials to recycle waste heat has gotten more attention. In the mature technical environment of the current Taiwan industry, the thermoelectric technologies have a high potential to benefit from technology transfers and technology authorizations. In recent years, it has been found that the thermoelectric material in the form of nanoscale wires has a higher Seebeck value and a higher thermoelectric figure of merit, and that cascaded P-type and N-type elements has a higher thermoelectric conversion efficiency than a single thermoelectric material. The present invention can fabricate a nanoscale thermoelectric element having very small dimensions, which can be directly integrated in the package of a semiconductor chip or an optoelectronic element to realize a local cooling function. Further, the thermoelectric element of the present invention can draw sufficient energy to generate electric power. Besides, the method of the present invention has a simple process and is suitable to mass produce nanoscale thermoelectric elements.

In conclusion, the present invention not only can fabricate a thermoelectric element containing P-type and N-type nanoscale wires and having a higher thermoelectric conversion efficiency, but also can adopt different substrates to form nanoscale pore structure suitable to fabricate high-melting point nanoscale wires.

The preferred embodiments described above are only to exemplify the present invention but not to limit the scope of the present invention. Therefore, any equivalent modification or variation according to the shapes, structures, characteristics and spirit disclosed in the present invention is to be also included within the scope of the present invention.

What is claimed is:

1. A method for fabricating a nanoscale thermoelectric device, comprising steps:
    (A) providing at least one template having a group of nanoscale pores;
    (B) forming a first substrate on a bottom of said template;
    (C) injecting a molten semiconductor material into said nanoscale pores with a pressure-casting method in a vacuum environment to form a group of semiconductor nanoscale wires; and
    (D) removing said first substrate to obtain a semiconductor nanoscale wire array.

2. The method for fabricating a nanoscale thermoelectric device according to claim 1, wherein said molten semiconductor material is a molten P-type semiconductor material, and said semiconductor nanoscale wire is a P-type semiconductor nanoscale wire, and said semiconductor nanoscale wire array is a P-type semiconductor nanoscale wire array.

3. The method for fabricating a nanoscale thermoelectric device according to claim 1, wherein said molten semiconductor material is a molten N-type semiconductor material, and said semiconductor nanoscale wire is an N-type semiconductor nanoscale wire, and said semiconductor nanoscale wire array is an N-type semiconductor nanoscale wire array.

4. The method for fabricating a nanoscale thermoelectric device according to claim 1 further comprising steps:
    (E) cascading at least two said semiconductor nanoscale wire arrays with metallic conductors; and
    (F) forming insulating layers on a top and bottom of the said metallic conductors.

5. The method for fabricating a nanoscale thermoelectric device according to claim 1, wherein said template is made of alumina, titanium oxide, silicon dioxide, opal or zeolite.

6. The method for fabricating a nanoscale thermoelectric device according to claim 1, wherein said first substrate is made of a ceramic material or a metallic material having a melting point higher than that of aluminum.

7. The method for fabricating a nanoscale thermoelectric device according to claim 1, wherein said nanoscale pore has a diameter of between 1 and 1000 nm.

8. The method for fabricating a nanoscale thermoelectric device according to claim 1, wherein said nanoscale pore has a length of between 100 nm and 300 µm.

9. The method for fabricating a nanoscale thermoelectric device according to claim 2, wherein said molten P-type semiconductor material is a P-type semiconductor material of a binary alloy or more than binary alloy.

10. The method for fabricating a nanoscale thermoelectric device according to claim 3, wherein said molten N-type semiconductor material is an N-type semiconductor material of a binary alloy or more than binary alloy.

11. The method for fabricating a nanoscale thermoelectric device according to claim 4, wherein said metallic conductor is made of gold, copper, silver, aluminum, a tin-lead alloy or a tin-silver-copper alloy.

12. A method for fabricating a nanoscale thermoelectric device, comprising steps:
    (A) providing a first template having a group of first nanoscale pores and a second template having a group of second nanoscale pores;
    (B) forming a first substrate on a bottom of said first template, and forming a second substrate on a bottom of said second template;
    (C) under a vacuum environment, using a pressure-casting method to inject a molten first type semiconductor material into said group of first nanoscale pores to form a group of first-type semiconductor nanoscale wires, and to inject a molten second type semiconductor material into said group of second nanoscale pores to form a group of second-type semiconductor nanoscale wires; and
    (D) removing said first substrate and said second substrate to obtain a first type semiconductor nanoscale wire array and a second type semiconductor nanoscale wire array.

13. The method for fabricating a nanoscale thermoelectric device according to claim 12 further comprising steps:
    (E) cascading in order at least one said first type semiconductor nanoscale wire array and at least one said second type semiconductor nanoscale wire array with metallic conductors; and
    (F) forming insulating layers on a top and bottom of the said metallic conductors.

14. The method for fabricating a nanoscale thermoelectric device according to claim 12, wherein when said molten first type semiconductor material is a molten N-type semiconductor material, said molten second type semiconductor material is a molten P-type semiconductor material; when said first-type semiconductor nanoscale wire is an N-type semiconductor nanoscale wire, said second-type semiconductor nanoscale wire is a P-type semiconductor nanoscale wire; when said first type semiconductor nanoscale wire array is an N-type semiconductor nanoscale wire array, said second type semiconductor nanoscale wire array is a P-type semiconductor nanoscale wire array.

15. The method for fabricating a nanoscale thermoelectric device according to claim 12, wherein when said molten first type semiconductor material is a molten P-type semiconductor material, said molten second type semiconductor material is a molten N-type semiconductor material; when said first-type semiconductor nanoscale wire is a P-type semiconductor nanoscale wire, said second-type semiconductor nanoscale wire is an N-type semiconductor nanoscale wire; when said first type semiconductor nanoscale wire array is a P-type semiconductor nanoscale wire array, said second type semiconductor nanoscale wire array is an N-type semiconductor nanoscale wire array.

16. The method for fabricating a nanoscale thermoelectric device according to claim 12, wherein said first template and said second template are made of alumina, titanium oxide, silicon dioxide, opal or zeolite.

17. The method for fabricating a nanoscale thermoelectric device according to claim 12, wherein said first substrate and said second substrate are made of ceramic materials or metallic materials whose melting point higher than aluminum.

18. The method for fabricating a nanoscale thermoelectric device according to claim 12, wherein said first nanoscale pore and said second nanoscale pore have diameters of between 1 and 1000 nm.

19. The method for fabricating a nanoscale thermoelectric device according to claim 12, wherein said first nanoscale pore and said second nanoscale pore have lengths of between 100 nm and 300 μm.

20. The method for fabricating a nanoscale thermoelectric device according to claim 14, wherein said molten P-type semiconductor material is a P-type semiconductor material of a binary alloy or more than binary alloy.

21. The method for fabricating a nanoscale thermoelectric device according to claim 15, wherein said molten P-type semiconductor material is a P-type semiconductor material of a binary alloy or more than binary alloy.

22. The method for fabricating a nanoscale thermoelectric device according to claim 14, wherein said molten N-type semiconductor material is an N-type semiconductor material of a binary alloy or more than binary alloy.

23. The method for fabricating a nanoscale thermoelectric device according to claim 15, wherein said molten N-type semiconductor material is an N-type semiconductor material of a binary alloy or more than binary alloy.

24. The method for fabricating a nanoscale thermoelectric device according to claim 13, wherein said metallic conductor is made of gold, copper, silver, aluminum, a tin-lead alloy or a tin-silver-copper alloy.

\* \* \* \* \*